（12）United States Patent
Kao et al.

(10) Patent No.: US 10,635,147 B2
(45) Date of Patent: Apr. 28, 2020

(54) DETECTING SYSTEM AND DETECTION CIRCUIT FOR DETECTING HEALTH STATUS OF BACKUP POWER SUPPLY MODULE

(71) Applicant: Innodisk Corporation, New Taipei (TW)

(72) Inventors: Chih-Chieh Kao, New Taipei (TW); Yueh-Feng Tsai, New Taipei (TW)

(73) Assignee: INNODISK CORPORATION, New Taipei (TW)

( * ) Notice: Subject to any disclaimer, the term of this patent is extended or adjusted under 35 U.S.C. 154(b) by 385 days.

(21) Appl. No.: 15/796,307

(22) Filed: Oct. 27, 2017

(65) Prior Publication Data

US 2018/0364776 A1 Dec. 20, 2018

(30) Foreign Application Priority Data

Jun. 15, 2017 (TW) .............................. 106120062 A (51) Int. Cl.

| G06F 1/26 | (2006.01) |
|---|---|
| G01R 31/40 | (2020.01) |
| H02J 7/00 | (2006.01) |
| H02J 9/06 | (2006.01) |

(52) U.S. Cl.
CPC ............... *G06F 1/26* (2013.01); *G01R 31/40* (2013.01); *H02J 7/0068* (2013.01); *H02J 9/061* (2013.01)

(58) Field of Classification Search
CPC ........ G01R 31/40; H02J 7/0068; H02J 9/061; G06F 1/26
See application file for complete search history.

(56) References Cited

U.S. PATENT DOCUMENTS

| 4,929,931 A * | 5/1990 | McCuen | .......... G01R 19/16542 320/161 |
|---|---|---|---|
| 7,619,417 B2 * | 11/2009 | Klang | ................ G01R 31/3648 324/427 |
| 2012/0130660 A1 * | 5/2012 | Neumeyer | ........... H04R 25/305 702/63 |

* cited by examiner

*Primary Examiner* — Terrell S Johnson
(74) *Attorney, Agent, or Firm* — Chun-Ming Shih (57) ABSTRACT

The invention provides a detection system and detection circuit for detecting health status of backup power supply module. The detection circuit comprises a boost converter, a controller, and at least one backup power supply module. The boost converter receives an input voltage to generate a first high voltage. When the detection circuit is operated in a detection state, the boost converter is inhibited to output the first high voltage, the backup power supply module can execute a discharging process to provide a discharged energy to a load device, the controller detects a time at which a discharged potential of the backup power supply module is dropped from a first voltage to a second voltage to obtain a discharged time detection value. The controller can know a health status of the backup power supply module by a comparison between the discharged time detection value and a discharged time threshold value.

20 Claims, 4 Drawing Sheets

DETECTING SYSTEM AND DETECTION CIRCUIT FOR DETECTING HEALTH STATUS OF BACKUP POWER SUPPLY MODULE

This non-provisional application claims priority claim under 35 U.S.C. § 119 (a) on Taiwan Patent Application No. 106120062 filed Jun. 15, 2017, the entire contents of which are incorporated herein by reference.

FIELD OF THE INVENTION

The present invention relates to a detection system and detection circuit, more particularly, to a detection system and detection circuit for detecting health status of backup power supply module.

BACKGROUND

In order to avoid the power outage occurred during the electronic device performing some important tasks, for example, the writing of important data, the issuing of emergency signal, a backup power supply module capable of providing a power energy can configured in the electronic device. When the power outage occurs, the required work power that the electronic device performs the important tasks can be provided by the discharged of the backup power supply module. However, the backup power supply module will gradually generate physical aging with the use of time, such that the charged storage capability of the backup power supply module is getting worse. When the charged storage capability of the backup power supply module is insufficient, the storage power energy of the backup power supply module may be depleted before the electronic device has not completed the performing of the important tasks yet.

For the above reason, the present invention provides an innovative detection circuit for detecting the heath status of the backup power supply module, the user can decides whether to replace a new backup power supply module into the electronic device or replace a new detection circuit having a new backup power supply module into the electronic device based on the detection result of the health status of the backup power supply module, which is the object to be achieved by the present invention.

SUMMARY

It is one object of the present invention to provide a detection system and detection circuit for detecting health status of backup power supply module, which can detect the health status of the backup power supply module in the form of firmware or software. When the detection circuit or the detection system detects that the backup power supply module is defective, it will issue a warning notice in the form of bright, audible or message displaying to remind that the user must replace a new backup power supply module or a new detection circuit having a backup power supply module, in such a way that the backup power supply module can provide a sufficient backup power supply to the electronic device so as to support the processing of the important tasks of the electronic device when the power off occurs.

It is another object of the present invention to provide a detection system and detection circuit for detecting health status of backup power supply module, which defines a discharged time threshold value, and detects a time at which a discharged potential of the backup power supply module is dropped from a first voltage to a second voltage so as to obtain a discharged time detection value. When the discharged time detection value is higher than the discharged time threshold value, the detection system or the detection circuit will determine that the backup power supply module is normal; on the contrary, when the discharged time detection value is lower than the discharged time threshold value, the detection system or the detection circuit will determine that the backup power supply module is defective.

To achieve the above object, the present invention provides a detection circuit for detecting health status of backup power supply module, which is applied in an electronic device, the detection circuit comprising: a first switch; a second switch; a boost converter for receiving an input voltage and generating a first high voltage; a controller connected to the first switch, the second switch, and the boost converter, respectively, when the detection circuit is operated in a normal operating state, the controller will send a first control signal to the first switch, the second switch, and the boost converter, so that the boost converter is allowed to output the first high voltage, the first switch is turned on, and the second switch is turned off; otherwise, when the detection circuit is operated in a detection state, the controller will send a second control signal to the first switch, the second switch, and the boost converter, so that the boost converter is inhibited to output the first high voltage, the first switch is turned off, and the second switch is turned on, wherein a discharged time threshold value is defined in the controller; and at least one backup power supply module, wherein the backup power supply module, the controller, the first switch, the second switch, and the boost converter are connected to a first node together, a node voltage is generated on the first node; wherein when the detection circuit is operated in the normal operating state, the backup power supply module can execute a charging process by the first high voltage outputted from the boost converter; when the detection circuit is operated in the detection state, the backup power supply module can execute a discharging process so as to provide a discharged energy to a load device via the second switch, the controller can detect a time at which the node voltage is dropped from a first voltage to a second voltage so as to obtain a discharged time detection value; thus, the controller can know a health status of the backup power supply module according to a comparison between the discharged time detection value and the discharged time threshold value.

In one embodiment of the present invention, wherein the detection circuit further comprises an indication unit connected to the controller, when the discharged time detection value is lower than the discharged time threshold value, the controller will send a signal indicating that the backup power supply module is defective to the indication unit so as to issue a warning notice by the indicating unit.

In one embodiment of the present invention, wherein the controller comprises at least one general purpose input and output port, the controller is connected to the first switch, the second switch, the boost converter, and the indication unit via the general purpose input and output port.

In one embodiment of the present invention, wherein the first switch is an NMOS transistor, an NPN BJT transistor, or a power switch enabled based on a high-level signal, and the second switch is a PMOS transistor, a PNP BJT transistor, or a power switch enabled based on a low-level signal.

In one embodiment of the present invention, wherein the first control signal is the high-level signal, and the second control signal is the low-level signal.

In one embodiment of the present invention, wherein the controller comprises a counter, the controller can detect the time at which the node voltage is dropped from the first voltage to the second voltage by a count of the counter so as to obtain the discharged time detection value.

In one embodiment of the present invention, wherein the controller comprises an analog to digital converter, the controller is connected to the first node via the analog to digital converter, converts the node voltage at the first node from an analog form to a digital form via the analog to digital converter, and detects a variation of the node voltage at the first node in a way of digital.

In one embodiment of the present invention, wherein the controller further defines at least one detection time, and periodically detects the health status of the backup power supply module based on the detection time.

In one embodiment of the present invention, wherein the controller detects the health status of the backup power supply module after the electronic device has executed a normal boot.

In one embodiment of the present invention, wherein when the detection circuit is operated in the normal operating state, the boost converter provides a power energy to the electronic device via the first switch.

In one embodiment of the present invention, wherein the detection circuit is connected to a computer host, when the detection circuit is operated in the detection state, if the controller detects that the discharged time detection value of the backup module is lower than the discharged time threshold value, the controller will send a signal indicating that the backup power supply module is defective to the computer host, or if the controller detects that the discharged time detection value of the backup module is higher than the discharged time threshold value, the controller will send a signal indicating that the backup power supply module is normal to the computer host.

The present invention further provides a detection system for detecting health status of backup power supply module, comprising: a computer host, comprising: a processor; a data transmission interface connected to the processor, wherein the computer host communicates with an electronic device via the data transmission interface; and a data storage unit, connected to the processor, and comprising an application program, wherein the application program defines a discharged time threshold value; and a detection circuit, configured in the electronic device, comprising: a first switch; a second switch; a boost converter for receiving an input voltage provided by the computer host, and generating a first high voltage; a controller connected to the first switch, the second switch, and the boost converter, respectively; and at least one backup power supply module, wherein the backup power supply module, the controller, the first switch, the second switch, and the boost converter are connected to a first node together, a node voltage is generated on the first node, when the detection circuit is operated in a normal operating state, the controller of the detection circuit will send a first control signal to the first switch, the second switch, and the boost converter, so that the boost converter is allowed to output the first high voltage, the first switch is turned on, and the second switch is turned off; otherwise, when the computer host desires to execute a health status detection process for the backup power supply module, the computer host sends a detection command to the detection circuit, the detection circuit is operated in a detection state according to the detection command, the controller of the detection circuit will send a second control signal to the first switch, the second switch, and the boost converter, so that the boost converter is inhibited to output the first high voltage, the first switch is turned off, and the second switch is turned on; and wherein when the detection circuit is operated in the normal operating state, the backup power supply module can execute a charging process by the first high voltage outputted from the boost converter; when the detection circuit is operated in the detection state, the backup power supply module can execute a discharging process so as to provide a discharged energy to a load device via the second switch, the controller can detect a time at which the node voltage is dropped from a first voltage to a second voltage so as to obtain a discharged time detection value, the discharged time detection value will be transmitted to the computer host via the data transmission interface; thus, the processor of the computer host can know a health status of the backup power supply module according to a comparison between the discharged time detection value and the discharged time threshold value, and show the health status of the backup power supply module on a display unit of the computer host.

In one embodiment of the present invention, wherein when the processor of the computer host determines that the discharged time detection value is higher than the discharged time threshold value, it will generate a signal indicating that the backup power supply module is normal, the signal indicating that the backup power supply module is normal will be shown on the display unit; otherwise, when the processor of the computer host determines that the discharged time detection value is lower than the discharged time threshold value, it will generate a signal indicating that the backup power supply module is defective, the signal indicating that the backup power supply module is defective will be shown on the display unit.

In one embodiment of the present invention, wherein the application program of the computer host further defines at least one detection time, the processor of the computer host periodically executes the health status detection process for the backup power supply module based on the detection time.

In one embodiment of the present invention, wherein the application program of the computer host comprises an operation interface having a detection starting button, the processor of the computer host can immediately execute the health status detection process for the backup power supply module by a pressing of the detection starting button.

DETAILED DESCRIPTION OF THE PREFERRED EMBODIMENTS

Figure 1:
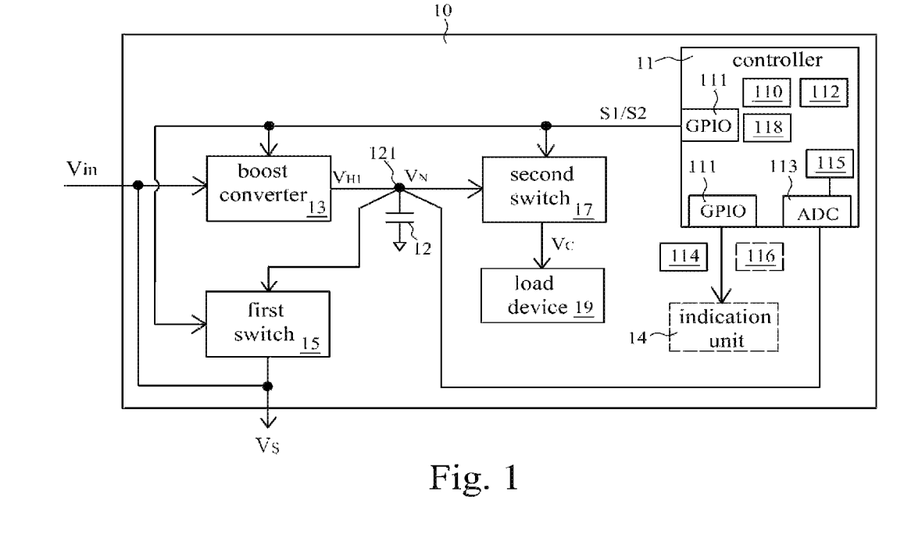
FIG. 1 is a circuit block diagram of a detection circuit for detecting health status of backup power supply module according to one embodiment of the present invention.

Referring to FIG. 1, there is shown a circuit block diagram of a detection circuit for detecting health status of backup power supply module according to one embodiment of the present invention. The detection circuit 10 is configured in a electronic device. When the power supply of the electronic device is powered off, at least one backup power supply module 12 in the detection circuit 10 will provide a backup energy, for example, a discharged energy, to the electronic device, so that the electronic device can complete the perform of the important tasks by the backup energy. For example, the electronic device is a data storage device, when the power supply of the data storage device is powered off, the required work power that the data storage device backs up an important data (such as financial data) can be provided by the backup energy of the backup power supply module 12, such that the important data can be kept. For example, the electronic device is a safety monitoring device, when the power supply of the safety monitoring device is powered off, the required work power that the safety monitoring device issues a notification of power off can be provided by the backup energy of the backup power supply module, so that the monitoring personnel, by using a communication device to receive the notification of power off sent from the safety monitoring device, can know that a blank period exists in the safety monitoring. As described in the background, the charged storage capability of the backup power supply module 12 is affected because the backup power supply module 12 will gradually generate physically aging with the use of time. When the charged storage capability of the backup power supply module is insufficient, it will affect that the electronic device executes the process of the important tasks when the power off occurs. Thus, the detection circuit 10 of the present invention will be used for detecting the health status of the backup power supply module 12 so that the user can decide whether to replace a new backup power supply module 12 based on the detection result of the health status of the backup power supply module 12. Besides, the above electronic devices, applied by the detection circuit 10 of the present invention, for example, the data storage device and the safety monitoring device, which are only parts of the embodiments, but not limited thereto.

As shown in FIG. 1, the detection circuit 10 comprises a controller 11, at least one backup power supply module 12, a boost converter 13, a first switch 15, and a second switch 17. The controller 11 comprises at least one general purpose input and output port (GPIO) 111. The controller 11 is connected to the boost converter 13, the first switch 15, and the second switch 17 via GPIO 111. The controller 11, the backup power supply module 12, the boost converter 13, the first switch 15, and the second switch 17 are connected to a first node 121 together. In one embodiment of the present invention, the backup power supply module 12 is a capacitor module, or a module capable for storing charge. A node voltage $V_N$ is generated on the first node 121. The boost converter 13 is for receiving and pulling up an input voltage Vin, and therefore generating a first high voltage $V_{H1}$. The boost converter 13 charges the backup power supply module 12 by first high voltage $V_{H1}$. In one embodiment of the present invention, the input voltage Vin is a voltage source provided by a computer host. In another embodiment of the present invention, the input voltage Vin is a voltage source provided by a supply mains.

When the detection circuit 10 is operated in a normal operating state, the controller 11 will send a first control signal S1 to the boost converter 13, the first switch 15, and the second switch 17. The first control signal S1 is a high-level signal. In the present invention, the boost converter 13 is a boost converter having a switch, the first switch 15 is an NMOS transistor, an NPN transistor, or a power switch enabled based on the high-level signal, and the second switch 17 is a PMOS transistor, a PNP transistor, or a power switch enabled based on the low-level signal. Based on the control of the first control signal S1, the boost converter 13 is allowed to output the first high voltage $V_{H1}$, the first switch 15 is turned on, and the second switch 17 is turned off. The backup power supply module 12 can execute a charging process by the first high voltage $V_{H1}$ outputted from the boost converter 13.

When the detection circuit 10 desires to execute a health status detection process for the backup power supply module 12, the detection circuit 10 enters a detection state, the controller 11 will send a second control signal S2 to the boost converter 13, the first switch 15, and the second switch 17. The second control signal S2 is a low-level signal. Based on the control of the second control signal S2, the boost converter 13 is inhibited to output the first high voltage $V_{H1}$, the first switch 15 is turned off, and the second switch 17 is turned on. The backup power supply module 12 can execute a discharging process so as to provide a discharged energy Vc to a load device 19 via the second switch 17. Besides, the firmware of the controller 11 of the present embodiment defines a discharged time threshold value $T_{TH}$ 110. The discharged time threshold value $T_{TH}$ is a minimum time required when the electronic device executes the important tasks. During the detection period, the controller 11 can detect a time at which the node voltage $V_N$ is dropped from a first voltage $V_1$ to a second voltage $V_2$ so as to obtain a discharged time detection value $T_D$ 112. In the present invention, the first voltage $V_1$ is a voltage when the backup power supply module 12 has fully charged, and the second voltage $V_2$ is a minimum voltage that the electronic device can be operated. Thus, the controller 11 can know the health status of the current backup power supply module 12 according to a comparison between the discharged time detection value $T_D$ 112 and the discharged time threshold value $T_{TH}$ 110.

Accordingly, when the detection circuit 10 is operated in the detection state or the input voltage Vin is powered off, the first switch 15 will be turned on by the control of the controller 11, the boost converter 13 provides a power energy Vs to the electronic device via the first switch 15. The power energy Vs is as a working power source of the electronic device. On the contrary, when the detection circuit 10 is operated in the normal operating state, the first switch 15 will be turned off by the control of the controller 11, the power energy Vs inputted to the electronic device will be provided by the input voltage Vin.

Figure 2:
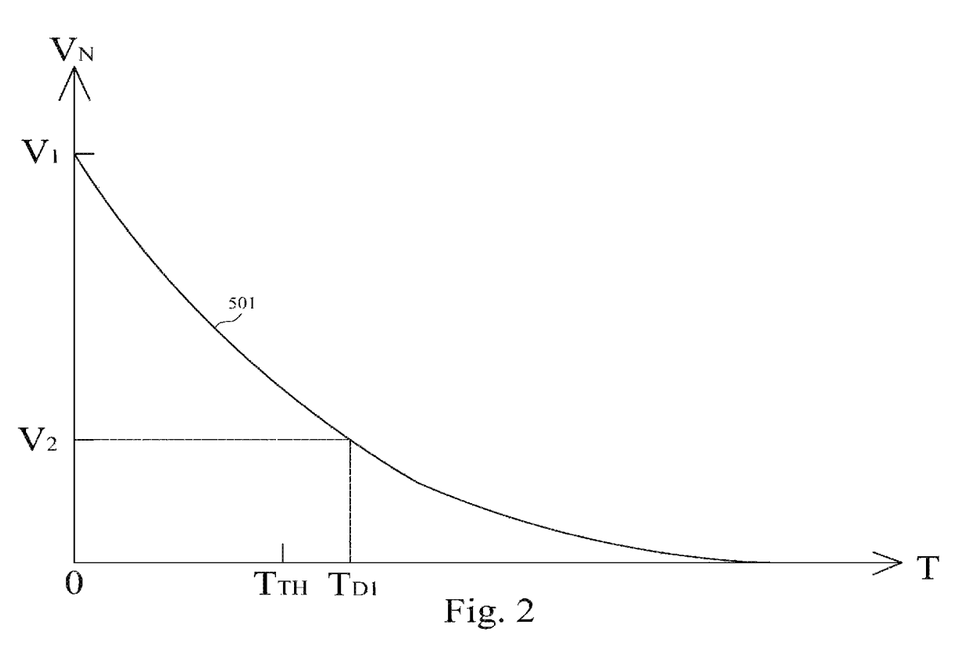
FIG. 2 is a discharge curve diagram of the backup power supply module of the present invention.

As shown in FIG. 2, a discharge curve 501 is formed by the backup power supply module 12 executing a discharging process. It is known from the discharge curve 501, the discharged time detection value $T_{D1}$ 112 detected by the controller 11 is higher than the discharged time threshold value $T_{TH}$ 110, which represents that the storage energy of the current backup power supply module 12 is sufficient to cope with the working energy required for the electronic device to perform the important tasks when the poweroff occurs, the health status of the current backup power supply module 12 is normal.

Figure 3:
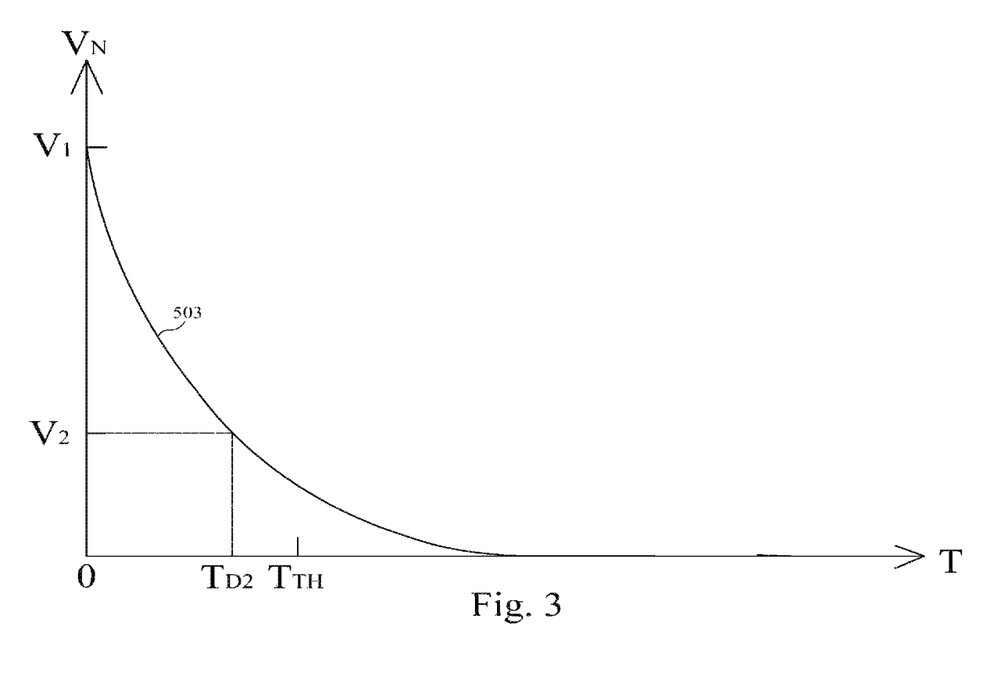
FIG. 3 is a discharge curve diagram of the backup power supply module of the present invention.

As shown in FIG. 3, otherwise, a discharge curve 503 is formed by the backup power supply module 12 executing the discharging process. It is known from the discharge curve 503, the discharged time detection value $T_{D2}$ 112 detected by the controller 11 is lower than the discharged time threshold value $T_{TH}$ 110, which represents that the storage power energy of the current backup power supply module 12 is insufficient, the time that the currently backup power supply module 12 can provide the power energy is short, resulting in the storage power energy of the backup power supply module 12 will be depleted before the electronic device has not completed the performing of the important tasks yet, the health status of the backup power supply module 12 is defective, the controller 11 must remind that the user replaces the backup power supply module 12 in the detection circuit 10.

In one embodiment of the present invention, the detection circuit 10 further comprises an indication unit 14, which is connected to the controller 11 via GPIO 111. The indication unit 14 is a LED or a buzzer. When the discharged time detection value $T_{D2}$ 112 is lower than the discharged time threshold value $T_{TH}$ 110, the controller 11 will send a signal 114 indicating that the backup power supply module 12 is defective to the indication unit 14; thus, the indication unit 14 can issue a warning notice in the form of bright or audible based on the signal 114, for example, the indication unit 14 emits a red light or sends a high frequency sound, to remind that the user must replace a new backup power supply module 12. In the present invention, of course, when the discharged time detection value $T_{D1}$ 112 is higher than the discharged time threshold value $T_{TH}$ 110, the controller 11 may also issue a signal 116 indicating that the backup power supply module 12 is normal to the indication unit 14; thus, the indication unit 14 can issue an indication notice in the form of bright based on the signal 116, for example, the indication unit 14 emits a green light. In another embodiment of the present invention, the detection unit 10 is further connected to a computer host, the controller 11 will send the signal 114/116 for indicating the health result of the backup power supply module 12 to the computer host so that the signal 114/116 can be shown on a display unit of the computer host.

The controller 11 further comprises an analog to digital converter (ADC) 113. The controller 11 is connected to the first node 121 via ADC 113, converts the node voltage $V_N$ at the first node 121 from an analog form to a digital form by ADC 113, and detects a variation of the node voltage $V_N$ at the first node 121 in a way of digital. Furthermore, the controller 11 further comprises a counter 115, and detects the time at which the node voltage $V_N$ is dropped from the first voltage $V_1$ to the second voltage $V_2$ by a count of the counter 115 so as to obtain the discharged time detection value $T_D$ 112.

In one embodiment of the present invention, the firmware of the controller 11 defines at least one detection time 118. The controller 11 periodically detects the health status of the backup power supply module 12 based on the detection time 118. For example, the detection time 118 is defined as one hour; the controller 11 periodically detects the health status of the backup power supply module 12 per hour. In another embodiment of the present invention, otherwise, the controller 11 immediately detects the health status of the backup power supply module 12 after the electronic device has executed a normal boot. Accordingly, the detection of the health status of the backup power supply module 12 of the present embodiment can be executed and decided by the firmware of the controller 11.

Figure 4:
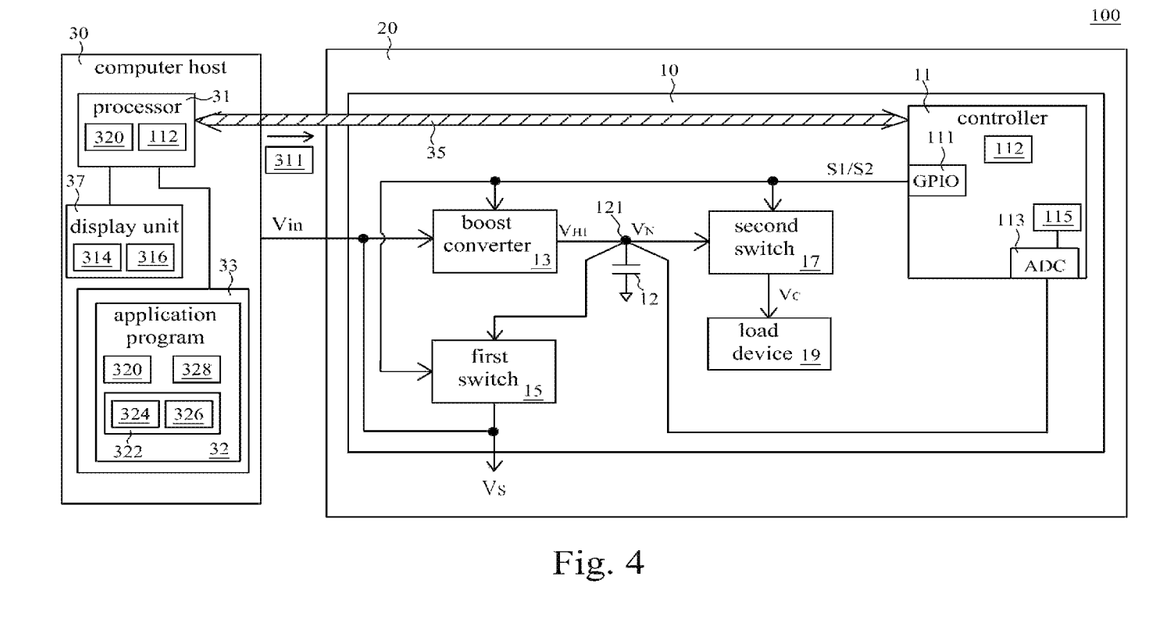
FIG. 4 is a circuit block diagram of a detection system for detecting health status of backup power supply module according to one embodiment of the present invention.

Referring to FIG. 4, there is shown a circuit block diagram of a detection system for detecting health status of backup power supply module according to one embodiment of the present invention. As shown in FIG. 4, the detection system 100 comprises an electronic device 20 and a computer host 30. The detection circuit 10 shown in FIG. 1 may be configured in the electronic device 20. The input voltage Vin of the electronic host 20 is provided by the computer host 30. The computer host 30 comprises a processor 31, a data storage unit 33, a data transmission interface 35, and a display unit 37. The processor 31 is connected to the data storage unit 33, the data transmission interface 35, and the display unit 37. The data storage unit 33 comprises an application program 32 for detecting the health status of the backup power supply module 12. The application program 32 defines a discharged time threshold value $T_{TH}$ 320. The discharged time threshold value $T_{TH}$ 320 is a minimum time required when the electronic device executes the important tasks.

The computer host 30 communicates with the electronic device 20 via the data transmission interface 35. When the computer host 30 desires to execute a health status detection process for the backup power supply module 12, it sends a detection command 311 to the detection circuit 10. The detection circuit 10 enters the detection state based on the detection command 311, the controller 11 of the detection circuit 10 will send a second control signal S2 to the boost converter 13, the first switch 15, and the second switch 17 so that the boost converter 13 is inhibited to output the first high voltage $V_{H1}$, the first switch 15 is turned off, and the second switch 17 is turned on. Continually, the backup power supply module 12 can execute a discharging process so as to provide a discharged energy Vc to a load device 19 via the second switch 17. The controller 11 can detect a time at which the node voltage $V_N$ is dropped from a first voltage V1 to a second voltage V2 so as to obtain a discharged time detection value $T_D$ 112. The discharged time detection value $T_D$ 112 detected by the controller 11 will be transmitted to the computer host 30 via the data transmission interface 35. Thus, the processor 31 of the computer host 30 can know the health status of the backup power supply module 12 according to the comparison between the discharged time detection value $T_D$ 112 and the discharged time threshold value $T_{TH}$ 320, and show the health status of the backup power supply module 12 on the display unit 37. For example, when the processor 31 of the computer host 30 determines that the discharged time detection value $T_D$ 112 is higher than the discharged time threshold value $T_{TH}$ 320, it will generate a signal 314 indicating that the backup power supply module 12 is normal, and show the signal 314 on the display unit 37. On the contrary, when the processor 31 of the computer host 30 determines that the discharged time detection value $T_D$ 112 is lower than the discharged time threshold value $T_{TH}$ 320, it will generate a signal 316 indicating that the backup power supply module 12 is defective, and show the signal 316 on the display unit 37.

In one embodiment of the present invention, the application program 32 of the computer host 30 defines at least one detection time 328. The processor 31 of the computer host 30 periodically executes the health status detection process for the backup power supply module 12 based on the detection time 328. For example, the detection time 328 is defined as one hour; the processor 31 of the computer host 30 periodically executes the health status detection process for the backup power supply module 12 per hour. In another embodiment of the present invention, the application program 32 comprises an operation interface 322 having a detection starting button 324. When the user desires to execute the detection for the health status of the backup power supply module 12, he can directly press the detection starting button 324 to generate a detection starting signal 326. Afterwards, the processor 31 will immediately generate the detection command 311 according to the detection starting signal 326, and send the detection command 311 to the detection circuit 10, so that the detection circuit 10 can execute the health status detection process for the backup power supply module 12.

Accordingly, the detection of the health status of the backup power supply module 12 of the present embodiment can be executed and decided by the firmware of the controller 11, as shown in FIG. 1. Otherwise, the detection of the health status of the backup power supply module 12 of the present embodiment can be executed and decided by the application program 32 of the computer host 30, as shown in FIG. 4.

Summing up, the detection circuit 10 or the detection system 100 of the present invention can detect the health status of the backup power supply module 12 in the form of firmware or software. When the detection circuit 10 or the detection system 100 detects that the backup power supply module 12 is defective, it will issue the warning notice in the form of bright, audible or message displaying to remind that the user must replace a new backup power supply module 12 or a new detection circuit 10 having a good backup power supply module 12, in such a way that the backup power supply module 12 can provide a sufficient backup power supply to the electronic device 20 so as to support the processing of the important tasks of the electronic device 20 when the power off occurs.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

The invention claimed is:

1. A detection circuit for detecting health status of backup power supply module, which is applied in an electronic device, the detection circuit comprising:
   a first switch;
   a second switch;
   a boost converter for receiving an input voltage and generating a first high voltage;
   a controller connected to the first switch, the second switch, and the boost converter, respectively, when the detection circuit is operated in a normal operating state, the controller will send a first control signal to the first switch, the second switch, and the boost converter, so that the boost converter is allowed to output the first high voltage, the first switch is turned on, and the second switch is turned off; otherwise, when the detection circuit is operated in a detection state, the controller will send a second control signal to the first switch, the second switch, and the boost converter, so that the boost converter is inhibited to output the first high voltage, the first switch is turned off, and the second switch is turned on, wherein a discharged time threshold value is defined in the controller; and
   at least one backup power supply module, wherein the backup power supply module, the controller, the first switch, the second switch, and the boost converter are connected to a first node together, a node voltage is generated on the first node;
   wherein when the detection circuit is operated in the normal operating state, the backup power supply module can execute a charging process by the first high voltage outputted from the boost converter; when the detection circuit is operated in the detection state, the backup power supply module can execute a discharging process so as to provide a discharged energy to a load device via the second switch, the controller can detect a time at which the node voltage is dropped from a first voltage to a second voltage so as to obtain a discharged time detection value; thus, the controller can know a health status of the backup power supply module according to a comparison between the discharged time detection value and the discharged time threshold value.

2. The detection circuit according to claim 1, wherein the detection circuit further comprises an indication unit connected to the controller, when the discharged time detection value is lower than the discharged time threshold value, the controller will send a signal indicating that the backup power supply module is defective to the indication unit so as to issue a warning notice by the indicating unit.

3. The detection circuit according to claim 2, wherein the controller comprises at least one general purpose input and output port, the controller is connected to the first switch, the second switch, the boost converter, and the indication unit via the general purpose input and output port.

4. The detection circuit according to claim 1, wherein the first switch is an NMOS transistor, an NPN BJT transistor, or a power switch enabled based on a high-level signal, and the second switch is a PMOS transistor, a PNP BJT transistor, or a power switch enabled based on a low-level signal.

5. The detection circuit according to claim 4, wherein the first control signal is the high-level signal, and the second control signal is the low-level signal.

6. The detection circuit according to claim 1, wherein the controller comprises a counter, the controller can detect the time at which the node voltage is dropped from the first voltage to the second voltage by a count of the counter so as to obtain the discharged time detection value.

7. The detection circuit according to claim 1, wherein the controller comprises an analog to digital converter, the controller is connected to the first node via the analog to digital converter, converts the node voltage at the first node from an analog form to a digital form via the analog to digital converter, and detects a variation of the node voltage at the first node in a way of digital.

8. The detection circuit according to claim 1, wherein the controller further defines at least one detection time, and periodically detects the health status of the backup power supply module based on the detection time.

9. The detection circuit according to claim 1, wherein the controller detects the health status of the backup power supply module after the electronic device has executed a normal boot.

10. The detection circuit according to claim 1, wherein when the detection circuit is operated in the normal operating state, the boost converter provides a power energy to the electronic device via the first switch.

11. The detection circuit according to claim 1, wherein the detection circuit is connected to a computer host, when the detection circuit is operated in the detection state, if the controller detects that the discharged time detection value of the backup module is lower than the discharged time threshold value, the controller will send a signal indicating that the backup power supply module is defective to the computer host, or if the controller detects that the discharged time detection value of the backup module is higher than the discharged time threshold value, the controller will send a signal indicating that the backup power supply module is normal to the computer host.

12. A detection system for detecting health status of backup power supply module, comprising:
   a computer host, comprising:
      a processor;
      a data transmission interface connected to the processor, wherein the computer host communicates with an electronic device via the data transmission interface; and a data storage unit, connected to the processor, and comprising an application program, wherein the application program defines a discharged time threshold value; and a detection circuit, configured in the electronic device, comprising:
a first switch;
a second switch;
a boost converter for receiving an input voltage provided by the computer host, and generating a first high voltage;
a controller connected to the first switch, the second switch, and the boost converter, respectively; and
at least one backup power supply module, wherein the backup power supply module, the controller, the first switch, the second switch, and the boost converter are connected to a first node together, a node voltage is generated on the first node, when the detection circuit is operated in a normal operating state, the controller of the detection circuit will send a first control signal to the first switch, the second switch, and the boost converter, so that the boost converter is allowed to output the first high voltage, the first switch is turned on, and the second switch is turned off; otherwise, when the computer host desires to execute a health status detection process for the backup power supply module, the computer host sends a detection command to the detection circuit, the detection circuit is operated in a detection state according to the detection command, the controller of the detection circuit will send a second control signal to the first switch, the second switch, and the boost converter, so that the boost converter is inhibited to output the first high voltage, the first switch is turned off, and the second switch is turned on; and wherein when the detection circuit is operated in the normal operating state, the backup power supply module can execute a charging process by the first high voltage outputted from the boost converter; when the detection circuit is operated in the detection state, the backup power supply module can execute a discharging process so as to provide a discharged energy to a load device via the second switch, the controller can detect a time at which the node voltage is dropped from a first voltage to a second voltage so as to obtain a discharged time detection value, the discharged time detection value will be transmitted to the computer host via the data transmission interface; thus, the processor of the computer host can know a health status of the backup power supply module according to a comparison between the discharged time detection value and the discharged time threshold value, and show the health status of the backup power supply module on a display unit of the computer host.

13. The detection system according to claim 12, wherein when the processor of the computer host determines that the discharged time detection value is higher than the discharged time threshold value, it will generate a signal indicating that the backup power supply module is normal, the signal indicating that the backup power supply module is normal will be shown on the display unit;

otherwise, when the processor of the computer host determines that the discharged time detection value is lower than the discharged time threshold value, it will generate a signal indicating that the backup power supply module is defective, the signal indicating that the backup power supply module is defective will be shown on the display unit.

14. The detection system according to claim 12, wherein the controller comprises at least one general purpose input and output port, the controller is connected to the first switch, the second switch, and the boost converter via the general purpose input and output port.

15. The detection system according to claim 12, wherein the first switch is an NMOS transistor, an NPN BJT transistor, or a power switch enabled based on a high-level signal, and the second switch is a PMOS transistor, a PNP BJT transistor, or a power switch enabled based on a low-level signal.

16. The detection system according to claim 15, wherein the first control signal is the high-level signal, and the second control signal is the low-level signal.

17. The detection system according to claim 12, wherein the controller comprises a counter, the controller can detect the time at which the node voltage is dropped from the first voltage to the second voltage by a count of the counter so as to obtain the discharged time detection value.

18. The detection system according to claim 12, wherein the controller comprises an analog to digital converter, the controller is connected to the first node via the analog to digital converter, converts the node voltage at the first node from an analog form to a digital form via the analog to digital converter, and detects a variation of the node voltage at the first node in a way of digital.

19. The detection system according to claim 12, wherein the application program of the computer host further defines at least one detection time, the processor of the computer host periodically executes the health status detection process for the backup power supply module based on the detection time.

20. The detection system according to claim 12, wherein the application program of the computer host comprises an operation interface having a detection starting button, the processor of the computer host can immediately execute the health status detection process for the backup power supply module by a pressing of the detection starting button.

* * * * *